(12) United States Patent
Jang et al.

(10) Patent No.: US 8,471,394 B2
(45) Date of Patent: Jun. 25, 2013

(54) INTEGRATED CIRCUIT PACKAGING SYSTEM WITH PACKAGE-ON-PACKAGE AND METHOD OF MANUFACTURE THEREOF

(75) Inventors: Ki Youn Jang, Ichon-si (KR); HeeJo Chi, Ichon-si (KR); NamJu Cho, Uiwang-si (KR)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 13/269,442

(22) Filed: Oct. 7, 2011

(65) Prior Publication Data

US 2012/0025398 A1 Feb. 2, 2012

Related U.S. Application Data

(63) Continuation of application No. 12/560,312, filed on Sep. 15, 2009, now Pat. No. 8,035,235.

(51) Int. Cl.
*H01L 23/52* (2006.01)
*H01L 23/48* (2006.01)

(52) U.S. Cl.
USPC ..... 257/787; 257/737; 257/780; 257/E23.116

(58) Field of Classification Search
USPC ............... 257/787, 737, 780, E23.116
See application file for complete search history.

(56) References Cited

U.S. PATENT DOCUMENTS

| | | | |
|---|---|---|---|
| 6,429,043 B1 * | 8/2002 | Nakazawa et al. | 438/106 |
| 6,667,439 B2 * | 12/2003 | Salatino et al. | 174/565 |
| 6,989,296 B2 | 1/2006 | Huang et al. | |
| 7,138,706 B2 | 11/2006 | Arai et al. | |
| 7,145,253 B1 | 12/2006 | Kim et al. | |
| 7,304,362 B2 | 12/2007 | Zhou et al. | |
| 7,345,361 B2 | 3/2008 | Mallik et al. | |
| 7,459,797 B2 | 12/2008 | James et al. | |
| 7,504,736 B2 | 3/2009 | Kim et al. | |
| 7,550,680 B2 | 6/2009 | Pendse | |
| 7,550,836 B2 | 6/2009 | Chou et al. | |
| 7,898,093 B1 | 3/2011 | Darveaux et al. | |
| 2007/0158806 A1 | 7/2007 | Kwon et al. | |
| 2007/0290376 A1 | 12/2007 | Zhao et al. | |
| 2008/0230887 A1 | 9/2008 | Sun et al. | |
| 2008/0284066 A1 | 11/2008 | Kuan et al. | |
| 2009/0057861 A1 | 3/2009 | Park et al. | |
| 2009/0315192 A1 | 12/2009 | Usami | |
| 2012/0319262 A1 * | 12/2012 | Kuan et al. | 257/687 |

OTHER PUBLICATIONS

Kim, Jinseong et al., "Application of Through Mold Via (TMV) as PoP Base Package", "IEEE 2008", May 2008, pp. 1089-1092, No. 58, Publisher: Electronics Components and Technology Conference, Published in: Lake Buena Vista, Fl, US.

* cited by examiner

*Primary Examiner* — Nitin Parekh
(74) *Attorney, Agent, or Firm* — Ishimaru & Associates LLP; I-Chang John Yang

(57) ABSTRACT

A method of manufacture of an integrated circuit packaging system includes: providing an encapsulation system having a mold chase with a buffer layer attached thereto; forming a base integrated circuit package including: providing a base substrate, connecting an exposed interconnect to the base substrate, a portion of the exposed interconnect having the buffer layer attached thereon, mounting a base component over the base substrate, and forming a base encapsulation over the base substrate and the exposed interconnect using the encapsulation system; and releasing the encapsulation system providing the portion of the exposed interconnect exposed from the base encapsulation, the exposed interconnect having characteristics of the buffer layer removed.

9 Claims, 5 Drawing Sheets

INTEGRATED CIRCUIT PACKAGING SYSTEM WITH PACKAGE-ON-PACKAGE AND METHOD OF MANUFACTURE THEREOF

CROSS-REFERENCE TO RELATED APPLICATION(S)

This is a continuation of co-pending U.S. patent application Ser. No. 12/560,312 filed Sep. 15, 2009.

TECHNICAL FIELD

The present invention relates generally to an integrated circuit packaging system, and more particularly to a system for an integrated circuit packaging system with package-on-package.

BACKGROUND ART

Important and constant goals of the computer industry include higher performance, lower cost, increased miniaturization of components, and greater packaging density for integrated circuits ("ICs"). As new generations of IC products are released, the number of IC devices needed to fabricate them tends to decrease due to advances in technology. Simultaneously, the functionality of these IC products increases. For example, on the average there is approximately a 10 percent decrease in components required for every IC product generation over a previous generation having equivalent functionality.

Semiconductor package structures continue to become thinner and ever more miniaturized. This results in increased component density in semiconductor packages and decreased sizes of the IC products in which the packages are used. These developmental trends are in response to continually increasing demands on electronic apparatus designers and manufacturers for ever-reduced sizes, thicknesses, and costs, along with continuously improving performance.

These increasing requirements for miniaturization are particularly noteworthy, for example, in portable information and communication devices such as cell phones, hands-free cell phone headsets, personal data assistants ("PDA's"), camcorders, notebook personal computers, and so forth. All of these devices continue to be made smaller and thinner to improve their portability. Accordingly, large-scale IC ("LSI") packages incorporated into these devices, as well as the package configurations that house and protect them, must also be made smaller and thinner.

In IC packaging, in addition to component size reduction, surface mount technology ("SMT") has demonstrated an increase in semiconductor chip density on a single substrate (such as a printed circuit board ("PCB")) despite the reduction in the number of components. SMT is a method used to connect packaged chips to substrates. With SMT, no through-holes in the substrate are required. Instead, package leads are soldered directly to the substrate surface. This results in more compact designs and form factors, and a significant increase in IC density and performance. However, despite these several reductions in size, IC density continues to be limited by the space or "real estate" available for mounting chips on a substrate.

One method to further increase IC density is to stack semiconductor chips vertically. Multiple stacked chips can be combined into a single package in this manner with a very small surface area or "footprint" on the PCB or other substrate. This solution of stacking IC components vertically has in fact been extended to the stacking of entire packages upon each other. Such package-on-package ("PoP") configurations continue to become increasingly popular as the semiconductor industry continues to demand semiconductor devices with lower costs, higher performance, increased miniaturization, and greater packaging densities. Continuing substantial improvements in PoP solutions are thus greatly needed to address these requirements.

Unfortunately, limitations of current PoP packing techniques can interfere with the ready incorporation and utilization of existing die and package configurations. It can also interfere with and limit the development of necessary increases in the input/output ("I/O") connections that are needed and that need to be accommodated within such PoP packages as they grow ever more complex with ever increasing functionality and capability.

Thus, a need still remains for an integrated circuit packaging system including smaller, thinner, lighter, less-expensive integrated circuit PoP systems when incorporating existing and increasingly complex die and package configurations. In view of the ever-increasing need to improve integration and cost reduction, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing an encapsulation system having a mold chase with a buffer layer attached thereto; forming a base integrated circuit package including: providing a base substrate, connecting an exposed interconnect to the base substrate, a portion of the exposed interconnect having the buffer layer attached thereon, mounting a base component over the base substrate, and forming a base encapsulation over the base substrate and the exposed interconnect using the encapsulation system; and releasing the encapsulation system providing the portion of the exposed interconnect exposed from the base encapsulation, the exposed interconnect having characteristics of the buffer layer removed.

The present invention provides an integrated circuit packaging system, including: a base integrated circuit package including: a base substrate, an exposed interconnect connected to the base substrate, a base component over the base substrate, and a base encapsulation, having characteristics of being formed by an encapsulation system with a mold chase and a buffer layer attached to the mold chase, the exposed interconnect having characteristics of the buffer layer removed and partially exposed from the base encapsulation.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
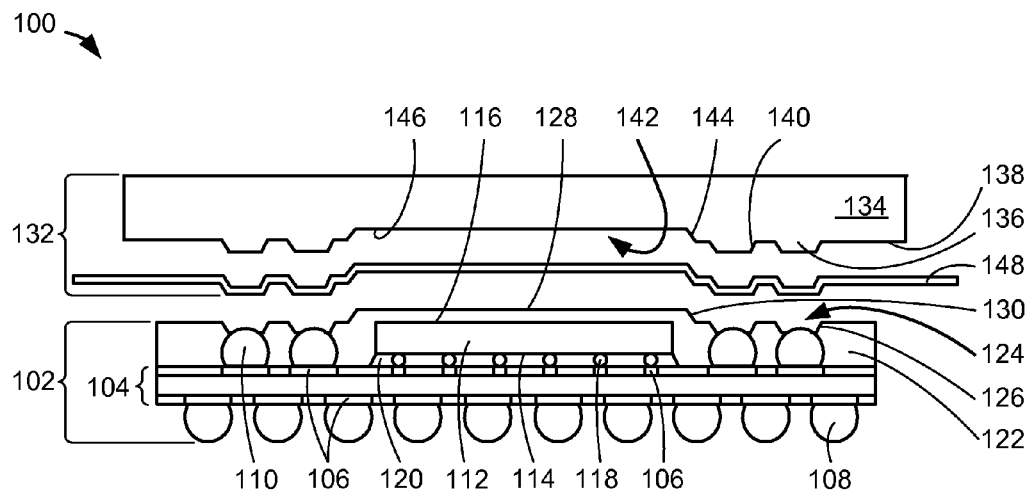
FIG. 1 is a cross-sectional view of an integrated circuit packaging system along a section line 1-1 of FIG. 3 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact among elements.

The term "processing" as used herein includes deposition of material or photoresist, patterning, exposure, development, etching, cleaning, and/or removal of the material or photoresist as required in forming a described structure.

Figure 3:
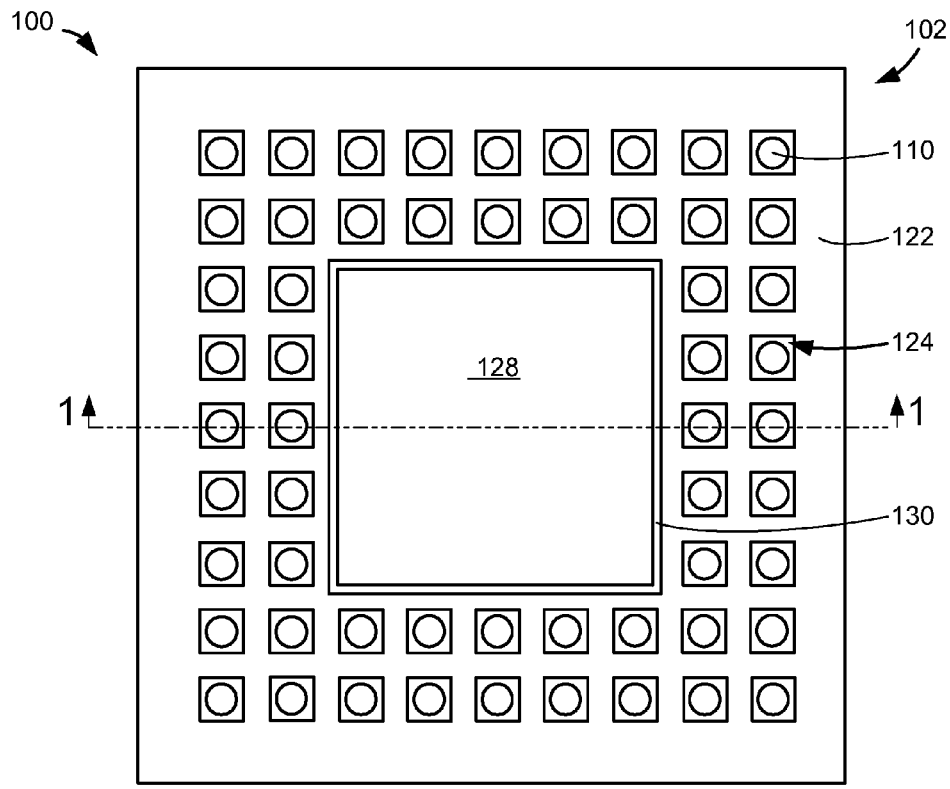
FIG. 3 is a top view of the integrated circuit packaging system without the encapsulation system.

Referring now to FIG. 1, therein is shown a cross-sectional view of an integrated circuit packaging system 100 along a section line 1-1 of FIG. 3 in a first embodiment of the present invention. The integrated circuit packaging system 100 can include a base integrated circuit package 102.

The base integrated circuit package 102 can include a base substrate 104, such as a printed circuit board (PCB), a laminated plastic substrate, a laminated ceramic substrate, or a carrier. The base substrate 104 can include a base substrate pad 106, such as an electrical contact or a contact pad, for providing electrical connection to the base substrate 104. The base substrate pad 106 can include any planar dimension.

The base integrated circuit package 102 can include an external interconnect 108, such as a solder ball or a solder bump, for providing electrical connectivity to external systems. The external interconnect 108 can be attached to the base substrate pad 106. The external interconnect 108 can be attached under the bottom of the base substrate 104.

The base integrated circuit package 102 can include an exposed interconnect 110, such as an exposed solder-on-pad (eSOP), a recessed eSOP, a solder ball, or a solder bump. The exposed interconnect 110 can be attached on or connected to the base substrate pad 106. The exposed interconnect 110 can be attached on or connected to the top of the base substrate 104.

The base integrated circuit package 102 can include a base component 112, such as a wirebond integrated circuit, a flip-chip, or a bare die. The base component 112 can include a base component active side 114, such as an active side that includes active circuitry. The base component 112 can include a base component inactive side 116, such as a backside, over the base component active side 114.

The exposed interconnect 110 can be attached or connected adjacent the base component 112 in an area array along the perimeter of the base integrated circuit package 102. The base integrated circuit package 102 can include any number of components. For example, another component (not shown) can be mounted or stacked over the base component 112.

The base component active side 114 can be mounted over the base substrate pad 106 at the top of the base substrate 104. The base integrated circuit package 102 can include a component-to-substrate interconnect 118, such as a solder ball or a solder bump, connecting the base component active side 114 and the base substrate pad 106. The base integrated circuit package 102 can include an underfill 120, such as a resin underfill, dispensed in the space between the base substrate 104 and the base component 112.

The base integrated circuit package 102 can include a base encapsulation 122, such as a cover including an epoxy molding compound, an encapsulation material, or a molding material, formed over the base substrate 104, the exposed interconnect 110, and the base component 112. The base encapsulation 122 can include a recess 124.

The base encapsulation 122 can include a recess sidewall 126 in the recess 124. A portion of the exposed interconnect 110 can be exposed from the base encapsulation 122 in the recess 124. The base encapsulation 122 can include another of the recess 124 having another of the exposed interconnect 110 exposed therein. The recess 124 can preferably include an opening or a planar dimension substantially the same or smaller than that of the exposed interconnect 110.

The base encapsulation 122 can include an upper surface 128 above the top of the recess 124 and over the base component 112. The base encapsulation 122 can include an upper taper sidewall 130 extended from the top of the recess 124 to the upper surface 128.

The integrated circuit packaging system 100 can include an encapsulation system 132 for forming the base encapsulation 122. The encapsulation system 132 can include a mold chase 134, such as a top mold chase, a top gate mold chase, or a lateral gate mold chase. The mold chase 134 can be secured, engaged, or joined to the base integrated circuit package 102.

The mold chase 134 can include a protrusion 136 taper and extended from a first bottom surface 138 of the mold chase 134. The mold chase 134 can include an area array of the protrusion 136 for forming an area array of the recess 124 along the perimeter of the base integrated circuit package 102. The mold chase 134 can include a protrusion sidewall 140 extended downwardly from the first bottom surface 138. The protrusion 136 can be formed in a planar shape including a square, a circle, a hexagon, or any other shape.

The mold chase 134 can include a cavity 142. The cavity 142 can be adjacent or in the center of the mold chase 134. The mold chase 134 can include a cavity sidewall 144 extended upwardly from the first bottom surface 138 to a second bottom surface 146 of the mold chase 134. The protrusion sidewall 140 or the cavity sidewall 144 can be formed in a slanted or taper configuration to facilitate the release or disengagement of the encapsulation system 132 from the base integrated circuit package 102.

The encapsulation system 132 can include a buffer layer 148, such as a film, a film assist mold (FAM), or a soft material, provided or applied between the mold chase 134 and the base integrated circuit package 102. The buffer layer 148 can make contact with or attach on the top surface of the exposed interconnect 110. The buffer layer 148 can be provided to absorb a mechanical stress resulting from pressing downwardly the mold chase 134 in an encapsulation phase of the base integrated circuit package 102. The buffer layer 148 can also be provided to compensate for an uneven stand-off height of the exposed interconnect 110.

The exposed interconnect 110 can include substantially the same shape as formed. The exposed interconnect 110 can have a characteristic of the buffer layer 148 removed. The exposed interconnect 110 can be un-damaged or protected by the buffer layer 148.

The encapsulation system 132 can be provided to form the base encapsulation 122 within the cavity 142 to cover the base substrate 104, the base component 112, and a portion of the exposed interconnect 110. The base encapsulation 122 can include characteristics of being formed by the encapsulation system 132. The characteristics of being formed by the encapsulation system 132 can include physical features, such as a tread or an imprint within a surface of the base encapsulation 122.

The protrusion 136 and the buffer layer 148 can be provided to expose a top portion of the exposed interconnect 110 from the base encapsulation 122 in the encapsulation phase of the base integrated circuit package 102. The encapsulation system 132 can be disengaged from the base integrated circuit package 102 at the end of the encapsulation phase.

The recess 124 can include a planar shape having characteristics of the encapsulation system 132 disengaged from the base integrated circuit package 102. The planar shape of the recess 124 can include that of the protrusion 136 such as a square, a circle, a hexagon, or any other shape.

The recess 124 and the recess sidewall 126 can preferably include characteristics of the mold chase 134 or the buffer layer 148 removed. The recess 124 can include an uneven or bulging surface due to compressing a portion of the buffer layer 148. The uneven or bulging surface can conform to the buffer layer 148. For example, an edge, a side, or an inner surface of the recess 124 can have a partially concave shape.

The base integrated circuit package 102 can be provided for stacking or mounting an additional component or package thereon via the exposed interconnect 110 that is partially exposed for connectivity between the base integrated circuit package 102 and the additional component or package. The integrated circuit packaging system 100 can include a singulation phase to produce individual units of the base integrated circuit package 102.

It has been discovered that the present invention can enable easier mold chase design and cheaper mold chase tooling cost compared to other packaging systems. The encapsulation system 132 can include the mold chase 134 and the buffer layer 148, such as a soft material including a film (FAM) or an elastomer. The buffer layer 148 can be provided between the mold chase 134 and the base integrated circuit package 102, thereby providing a simple and cost-effective encapsulation system.

It has also been discovered that the present invention can preserve the original shape and provide a strong coplanarity of the exposed interconnect 110. Having the buffer layer 148 directly contacts the top surface of the exposed interconnect 110 can keep the original shape and provide a strong coplanarity of the exposed interconnect 110. The buffer layer 148 can compensate for uneven stand-off height of the exposed interconnect 110 and can absorb the mechanical stress resulting from a pressing or an exertion of pressure on the mold chase 134.

It has further been discovered that the present invention can provide an easy release or disengagement of the encapsulation system 132 from the base encapsulation 122. The easy release or disengagement can be provided by having the recess sidewall 126 formed by the protrusion sidewall 140. The protrusion sidewall 140 can be formed in a slanted or taper configuration to facilitate the release or disengagement of the encapsulation system 132.

Figure 2:
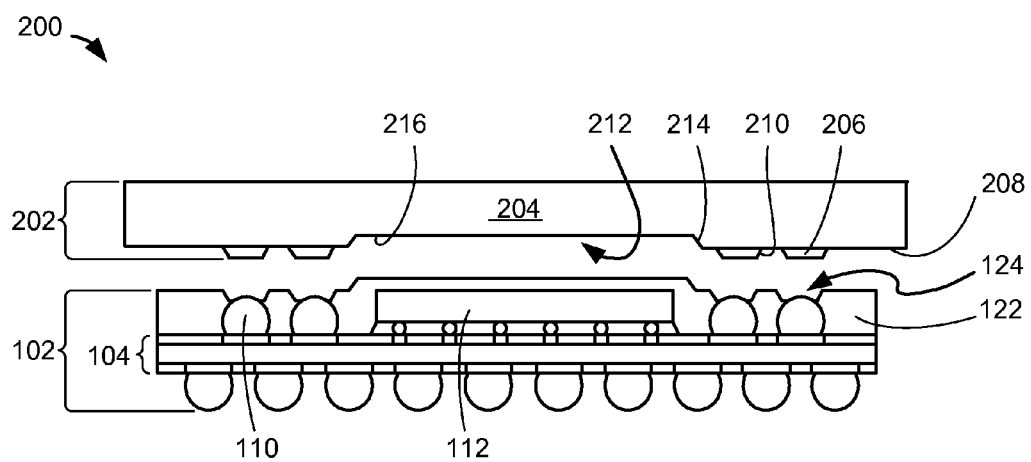
FIG. 2 is a cross-sectional view similar to FIG. 1 of an integrated circuit packaging system in a second embodiment of the present invention.

Referring now to FIG. 2, therein is shown a cross-sectional view similar to FIG. 1 of an integrated circuit packaging system 200 in a second embodiment of the present invention. The integrated circuit packaging system 200 can include the base integrated circuit package 102.

The integrated circuit packaging system 200 can include an encapsulation system 202 for forming the base encapsulation 122. The encapsulation system 202 can include a mold chase 204, such as a top mold chase, a top gate mold chase, or a lateral gate mold chase. The mold chase 204 can be secured, engaged, or joined to the base integrated circuit package 102.

The mold chase 204 can include a buffer layer 206, such as an elastomer, a silicone rubber, a heat-resistance plastic or rubber, a polyimide or fluorinated resin, an elastic material, or a soft material. The buffer layer 206 can be attached to a first bottom surface 208 of the mold chase 204. The buffer layer 206 can be provided for forming an area array of the recess 124 along the perimeter of the base integrated circuit package 102. The buffer layer 206 can include a buffer layer sidewall 210 extended downwardly from the first bottom surface 208.

The buffer layer 206 can be formed in a planar shape including a square, a circle, a hexagon, or any other shape. The buffer layer 206 can be attached between the mold chase 204 and the base integrated circuit package 102. The buffer layer 206 can be provided to absorb a mechanical stress resulting from pressing downwardly the mold chase 204 in an encapsulation phase of the base integrated circuit package 102. The buffer layer 206 can also be provided to compensate for an uneven stand-off height of the exposed interconnect 110.

The mold chase 204 can include a cavity 212. The cavity 212 can be adjacent or in the center of the mold chase 204. The mold chase 204 can include a cavity sidewall 214 extended upwardly from the first bottom surface 208 to a second bottom surface 216 of the mold chase 204. The buffer layer sidewall 210 or the cavity sidewall 214 can be formed in a slanted or taper configuration to facilitate the release or disengagement of the encapsulation system 202 from the base integrated circuit package 102.

The encapsulation system 202 can be provided to form the base encapsulation 122 within the cavity 212 to cover the base substrate 104, the base component 112, and a portion of the exposed interconnect 110. The base encapsulation 122 can include characteristics of being formed by the encapsulation system 202. The characteristics of being formed by the encapsulation system 202 can include physical features, such as a tread or an imprint within a surface of the base encapsulation 122.

The buffer layer 206 can be provided to expose a top portion of the exposed interconnect 110 from the base encapsulation 122 in the encapsulation phase of the base integrated circuit package 102. The encapsulation system 202 can be disengaged from the base integrated circuit package 102 at the end of the encapsulation phase.

The recess 124 can include a planar shape having characteristics of the encapsulation system 202 disengaged from the base integrated circuit package 102. The planar shape of the recess 124 can include that of the buffer layer 206 such as a square, a circle, a hexagon, or any other shape.

The base integrated circuit package 102 can be provided for stacking or mounting an additional component or package thereon via the exposed interconnect 110 that is partially exposed for connectivity between the base integrated circuit package 102 and the additional component or package. The integrated circuit packaging system 200 can include a singulation phase to produce individual units of the base integrated circuit package 102.

Referring now to FIG. 3, therein is shown a top view of the integrated circuit packaging system 100 without the encapsulation system 132 of FIG. 1. The integrated circuit packaging system 100 can include the exposed interconnect 110 attached on or connected to the top of the base substrate 104 of FIG. 1. The exposed interconnect 110 can be formed in an area array along the perimeter of the base integrated circuit package 102.

The integrated circuit packaging system 100 can include the base encapsulation 122 formed over the base substrate 104, the exposed interconnect 110, and the base component 112 of FIG. 1. The base encapsulation 122 can include the recess 124. The base encapsulation 122 can include the upper surface 128 above the top of the recess 124 and over the base component 112. The base encapsulation 122 can include the upper taper sidewall 130 extended from the top of the recess 124 to the upper surface 128.

Figure 4:
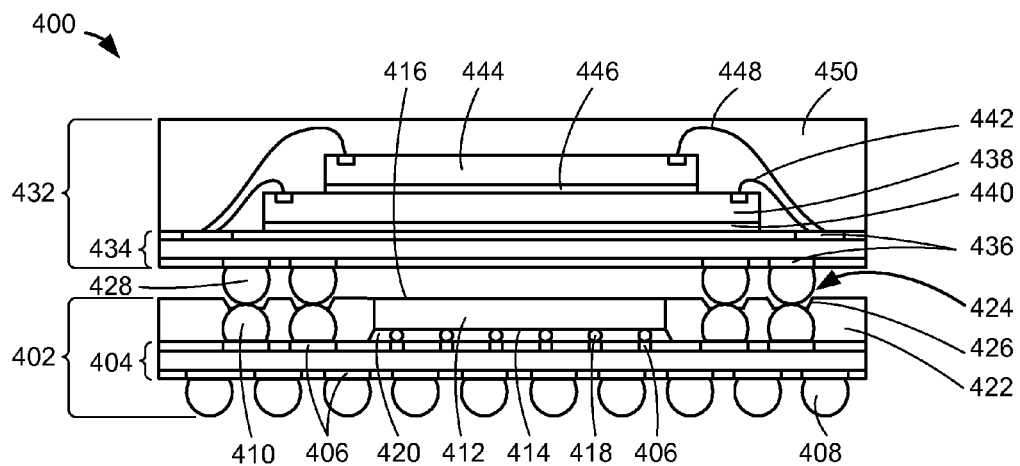
FIG. 4 is a cross-sectional view of an integrated circuit packaging system along a section line 4-4 of FIG. 5 in a third embodiment of the present invention.
Figure 5:
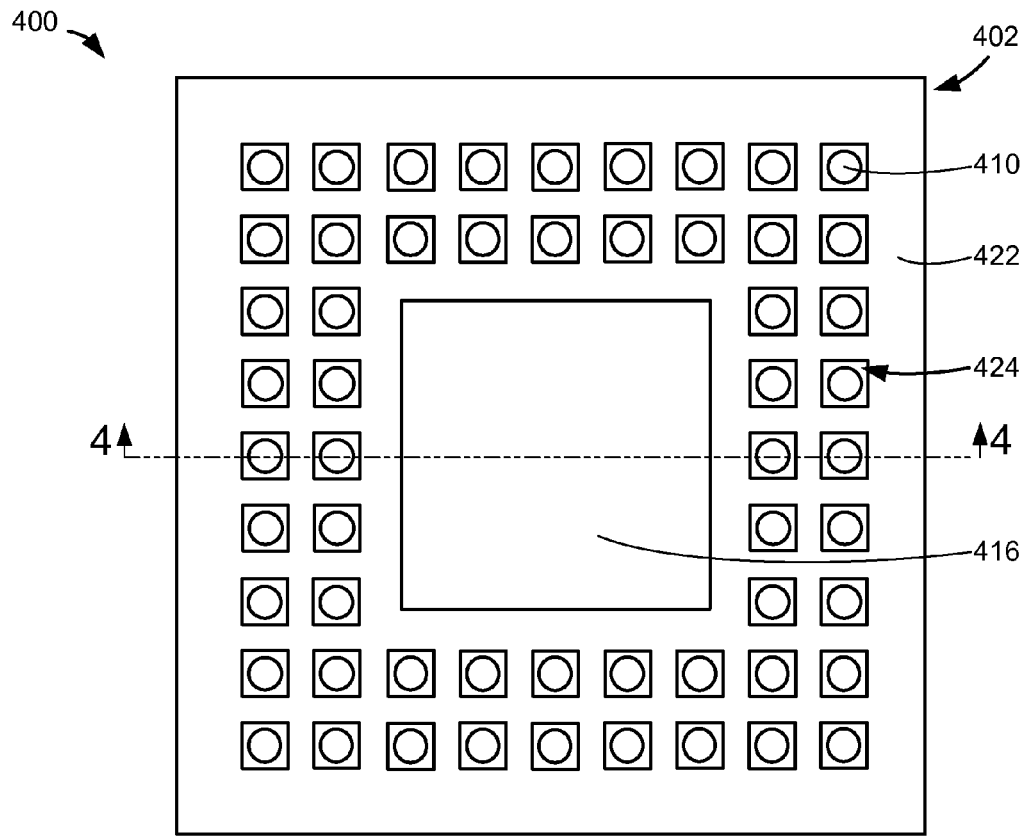
FIG. 5 is a top view of the integrated circuit packaging system without the stack integrated circuit package.

Referring now to FIG. 4, therein is shown a cross-sectional view of an integrated circuit packaging system 400 along a section line 4-4 of FIG. 5 in a third embodiment of the present invention. The integrated circuit packaging system 400 can include a base integrated circuit package 402.

The base integrated circuit package 402 can include a base substrate 404, such as a printed circuit board (PCB), a laminated plastic substrate, a laminated ceramic substrate, or a carrier. The base substrate 404 can include a base substrate pad 406, such as an electrical contact or a contact pad, for providing electrical connection to the base substrate 404. The base substrate pad 406 can include any planar dimension.

The base integrated circuit package 402 can include an external interconnect 408, such as a solder ball or a solder bump, for providing electrical connectivity to external systems. The external interconnect 408 can be attached to the base substrate pad 406. The external interconnect 408 can be attached under the bottom of the base substrate 404.

The base integrated circuit package 402 can include an exposed interconnect 410, such as an exposed solder-on-pad (eSOP), a recessed eSOP, a solder ball, or a solder bump. The exposed interconnect 410 can be attached on or connected to the base substrate pad 406. The exposed interconnect 410 can be attached on or connected to the top of the base substrate 404.

The base integrated circuit package 402 can include a base component 412, such as a wirebond integrated circuit, a flip-chip, or a bare die. The base component 412 can include a base component active side 414, such as an active side that includes active circuitry. The base component 412 can include a base component inactive side 416, such as a backside, over the base component active side 414.

The exposed interconnect 410 can be attached or connected adjacent the base component 412 in an area array along the perimeter of the base integrated circuit package 402. The base integrated circuit package 402 can include any number of components. For example, another component (not shown) can be mounted or stacked over the base component 412.

The base component active side 414 can be mounted over the base substrate pad 406 at the top of the base substrate 404. The base integrated circuit package 402 can include a component-to-substrate interconnect 418, such as a solder ball or a solder bump, connecting the base component active side 414 and the base substrate pad 406. The base integrated circuit package 402 can include an underfill 420, such as a resin underfill, dispensed in the space between the base substrate 404 and the base component 412.

The base integrated circuit package 402 can include a base encapsulation 422, such as a cover including an epoxy molding compound, an encapsulation material, or a molding material, formed over the base substrate 404, the exposed interconnect 410, and the base component 412. The integrated circuit packaging system 400 can include the encapsulation system 132 of FIG. 1 or the encapsulation system 202 of FIG. 2 for forming the base encapsulation 422. The base encapsulation 422 can include a recess 424.

The base encapsulation 422 can include a recess taper sidewall 426 in the recess 424. The base encapsulation 422 can expose a portion of the exposed interconnect 410 in the recess 424. The base encapsulation 422 can partially expose the base component 412. The base encapsulation 422 can expose the base component inactive side 416. The planar surface of the base encapsulation 422 can be coplanar with that of the base component inactive side 416.

The integrated circuit packaging system 400 can include a package-to-package interconnect 428, such as a solder ball or a solder bump, attached on or connected to the exposed interconnect 410. The integrated circuit packaging system 400 can include a stack integrated circuit package 432.

The stack integrated circuit package 432 can include a stack substrate 434, such as a printed circuit board (PCB), a laminated plastic substrate, a laminated ceramic substrate, or a carrier. The stack substrate 434 can include a stack substrate pad 436, such as an electrical contact or a contact pad, for providing electrical connection to the stack substrate 434. The stack substrate pad 436 can include any planar dimension.

The stack integrated circuit package 432 can be mounted over the base integrated circuit package 402. The package-to-package interconnect 428 can connect the stack substrate pad 436 at the bottom surface of the stack substrate 434 and the exposed interconnect 410.

The stack integrated circuit package 432 can include a first stack component 438, such as a wirebond integrated circuit or a bare die, attached over the stack substrate 434 by a first stack attach layer 440, such as a die attach, an adhesive, or an underfill. The first stack component 438 can be connected to the stack substrate pad 436 at the top surface of the stack substrate 434 by a first stack interconnect 442, such as a bond wire or a conductive wire.

The stack integrated circuit package 432 can include a second stack component 444, such as a wirebond integrated circuit or a bare die, attached over the first stack component 438 by a second stack attach layer 446, such as a die attach, an adhesive, or an underfill. The second stack component 444 can be connected to the stack substrate pad 436 at the top surface of the stack substrate 434 by a second stack interconnect 448, such as a bond wire or a conductive wire.

The stack integrated circuit package 432 can include a stack encapsulation 450, such as a cover including an epoxy molding compound, an encapsulation material, or a molding material. The stack encapsulation 450 can be formed over the stack substrate 434, the first stack component 438, the first stack interconnect 442, the second stack component 444, and the second stack interconnect 448.

It has been discovered that the present invention can provide less warpage. The encapsulation system 132 or the encapsulation system 202 can be provided to form the base encapsulation 422 covering a portion of the exposed interconnect 410. The stack integrated circuit package 432 can be mounted over the base integrated circuit package 402. In a reflow phase, the package-to-package interconnect 428 and the exposed interconnect 410 can be melted to form another solder ball, producing a stress on the base substrate 404. Having the base encapsulation 422 covering a portion of the exposed interconnect 410 can support the base integrated circuit package 402 to withstand the impact of the stress, thereby warpage can be reduced or eliminated. The buffer layer 148 of FIG. 1 or the buffer layer 206 of FIG. 2 can prevent the exposed interconnect 110 from being damaged.

It has also been discovered that the present invention can provide improved connectivity. The integrated circuit packaging system 400 can include a predetermined ball pitch of the exposed interconnect 410, allowing the stack integrated circuit package 432 to have a fine ball pad pitch. Therefore, the number of inputs/outputs (I/Os) can be increased.

It has further been discovered that the present invention can provide improved integration. By providing the exposed interconnect 410 in the recess 424, the integrated circuit packaging system 400 can provide self-alignment when mounting the stack integrated circuit package 432 over the base integrated circuit package 402. In addition, the integrated circuit packaging system 400 can prevent solder bridge as compared to conventional PoP-eSOP packages.

Referring now to FIG. 5, therein is shown a top view of the integrated circuit packaging system 400 without the stack integrated circuit package 432 of FIG. 4. The integrated circuit packaging system 400 can include the exposed interconnect 410 attached on or connected to the top of the base substrate 404 of FIG. 4. The exposed interconnect 410 can be formed in an area array along the perimeter of the base integrated circuit package 402.

The integrated circuit packaging system 400 can include the base encapsulation 422 formed over the base substrate 404, the exposed interconnect 410, and the base component 412 of FIG. 4. The base encapsulation 422 can include the recess 424.

The base encapsulation 422 can expose a portion of the exposed interconnect 410 in the recess 424. The integrated circuit packaging system 400 can include the base component inactive side 416 exposed from the base encapsulation 422.

Figure 6:
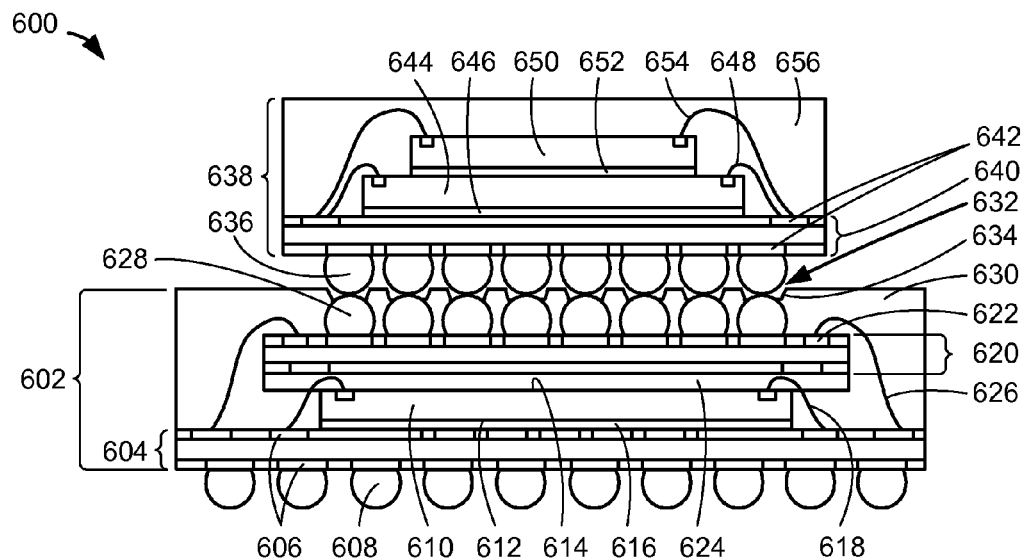
FIG. 6 is a cross-sectional view of an integrated circuit packaging system along a section line 6-6 of FIG. 8 in a fourth embodiment of the present invention.
Figure 8:
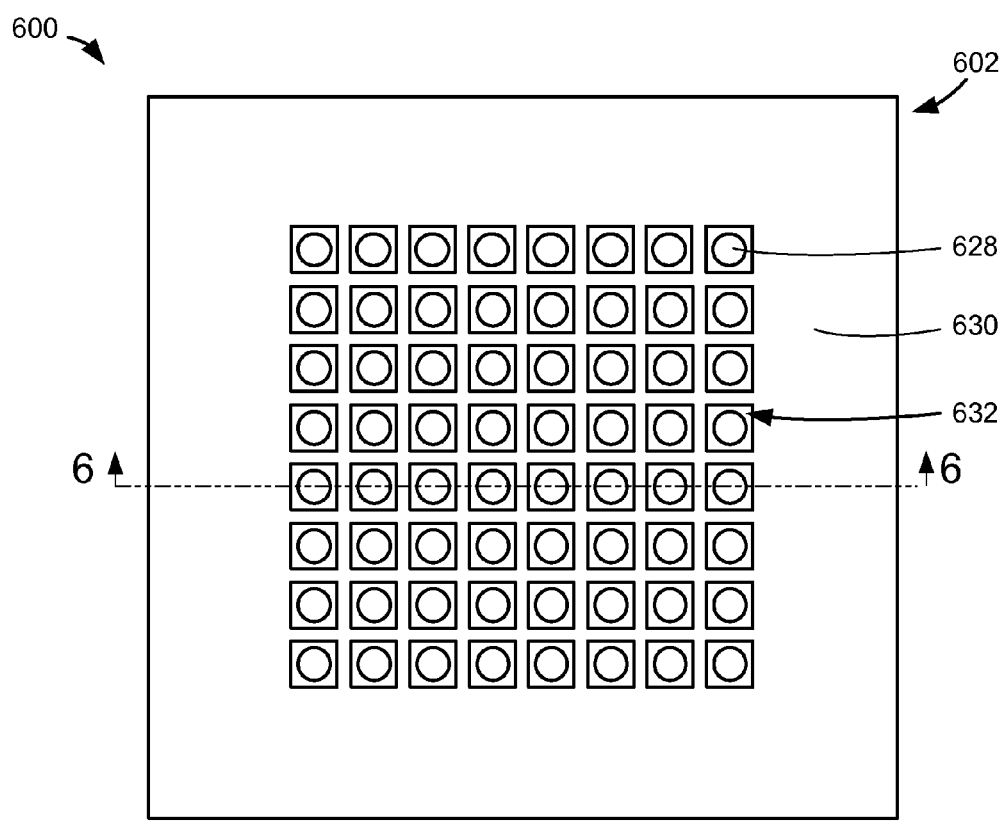
FIG. 8 is a top view of the integrated circuit packaging system without the stack integrated circuit package.

Referring now to FIG. 6, therein is shown a cross-sectional view of an integrated circuit packaging system 600 along a section line 6-6 of FIG. 8 in a fourth embodiment of the present invention. The integrated circuit packaging system 600 can include a base integrated circuit package 602. The base integrated circuit package 602 can include a fan-in PoP.

The base integrated circuit package 602 can include a base substrate 604, such as a printed circuit board (PCB), a laminated plastic substrate, a laminated ceramic substrate, or a carrier. The base substrate 604 can include a base substrate pad 606, such as an electrical contact or a contact pad, for providing electrical connection to the base substrate 604. The base substrate pad 606 can include any planar dimension.

The base integrated circuit package 602 can include an external interconnect 608, such as a solder ball or a solder bump, for providing electrical connectivity to external systems. The external interconnect 608 can be attached to the base substrate pad 606. The external interconnect 608 can be attached under the bottom of the base substrate 604.

The base integrated circuit package 602 can include a base component 610, such as a wirebond integrated circuit, a flip-chip, or a bare die. The base component 610 can include a base component inactive side 612, such as a backside. The base component 610 can include a base component active side 614, such as an active side that includes active circuitry, over the base component inactive side 612.

The base component 610 can be attached over the base substrate 604 by a first base attach layer 616, such as a die attach, an adhesive, or an underfill. The first base attach layer 616 can attach the base component inactive side 612 and the top surface of the base substrate 604. The base component 610 can be connected to the base substrate 604 by a first base interconnect 618, such as a bond wire or a conductive wire. The first base interconnect 618 can connect the base component active side 614 and the base substrate pad 606 at the top of the base substrate 604.

The base integrated circuit package 602 can include an interface module 620, such as an interposer or an internal stacking module (ISM). The interface module 620 can include an interface pad 622, such as an electrical contact or a contact pad. The interface module 620 can be attached over the base component 610 by a second base attach layer 624, such as an adhesive, a gel, or an epoxy. The interface module 620 can overhang the base component 610.

The interface module 620 can be connected to the base substrate 604 by a second base interconnect 626, such as a bond wire or a conductive wire. The second base interconnect 626 can connect the interface pad 622 at the top of the interface module 620 and the base substrate pad 606 at the top of the base substrate 604.

The base integrated circuit package 602 can include an exposed interconnect 628, such as an exposed solder-on-pad (eSOP), a recessed eSOP, a solder ball, or a solder bump. The exposed interconnect 628 can be attached on or connected to another of the interface pad 622 at the top of the interface module 620.

The exposed interconnect 628 can be formed in a full array at the top center of the base integrated circuit package 602 for providing connectivity with another package or component. The interface module 620 can include connectivity from the interface pad 622 connected to the second base interconnect 626 to the another of the interface pad 622 attached to the exposed interconnect 628, thereby connecting the exposed interconnect 628 to the base substrate 604.

The base integrated circuit package 602 can include a base encapsulation 630, such as a cover including an epoxy molding compound, an encapsulation material, or a molding material, formed over the base substrate 604, the base component 610, the first base interconnect 618, the exposed interconnect 628, the second base interconnect 626, and the exposed interconnect 628. The integrated circuit packaging system 600 can include the encapsulation system 132 of FIG. 1 or the encapsulation system 202 of FIG. 2 for forming the base encapsulation 630 in the base integrated circuit package 602. The base encapsulation 630 can include a recess 632.

The base encapsulation 630 can include a recess taper sidewall 634 in the recess 632. The base encapsulation 630 can expose a portion of the exposed interconnect 628 in the recess 632.

The integrated circuit packaging system 600 can include a package-to-package interconnect 636, such as a solder ball or a solder bump, attached on or connected to the exposed interconnect 628. The integrated circuit packaging system 600 can include a stack integrated circuit package 638.

The stack integrated circuit package 638 can include a stack substrate 640, such as a printed circuit board (PCB), a laminated plastic substrate, a laminated ceramic substrate, or a carrier. The stack substrate 640 can include a stack substrate pad 642, such as an electrical contact or a contact pad, for providing electrical connection to the stack substrate 640. The stack substrate pad 642 can include any planar dimension.

The stack integrated circuit package 638 can be mounted over the base integrated circuit package 602. The package-to-package interconnect 636 can connect the stack substrate pad 642 at the bottom surface of the stack substrate 640 and the exposed interconnect 628.

The stack integrated circuit package 638 can include a first stack component 644, such as a wirebond integrated circuit or a bare die, attached over the stack substrate 640 by a first stack attach layer 646, such as a die attach, an adhesive, or an underfill. The first stack component 644 can be connected to the stack substrate pad 642 at the top surface of the stack substrate 640 by a first stack interconnect 648, such as a bond wire or a conductive wire.

The stack integrated circuit package 638 can include a second stack component 650, such as a wirebond integrated circuit or a bare die, attached over the first stack component 644 by a second stack attach layer 652, such as a die attach, an adhesive, or an underfill. The second stack component 650 can be connected to the stack substrate pad 642 at the top surface of the stack substrate 640 by a second stack interconnect 654, such as a bond wire or a conductive wire.

The stack integrated circuit package 638 can include a stack encapsulation 656, such as a cover including an epoxy molding compound, an encapsulation material, or a molding material. The stack encapsulation 656 can be formed over the stack substrate 640, the first stack component 644, the first stack interconnect 648, the second stack component 650, and the second stack interconnect 654.

Figure 7:
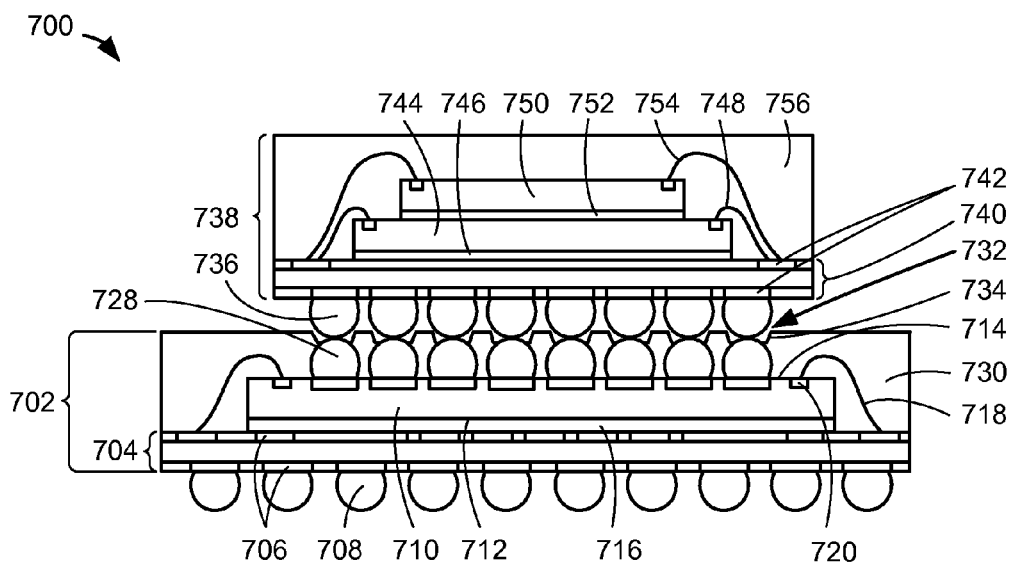
FIG. 7 is a cross-sectional view similar to FIG. 6 of an integrated circuit packaging system in a fifth embodiment of the present invention.

Referring now to FIG. 7, therein is shown a cross-sectional view similar to FIG. 6 of an integrated circuit packaging system 700 in a fifth embodiment of the present invention. The integrated circuit packaging system 700 can include a base integrated circuit package 702. The base integrated circuit package 702 can include a fan-in PoP.

The base integrated circuit package 702 can include a base substrate 704, such as a printed circuit board (PCB), a laminated plastic substrate, a laminated ceramic substrate, or a carrier. The base substrate 704 can include a base substrate pad 706, such as an electrical contact or a contact pad, for providing electrical connection to the base substrate 704. The base substrate pad 706 can include any planar dimension.

The base integrated circuit package 702 can include an external interconnect 708, such as a solder ball or a solder bump, for providing electrical connectivity to external systems. The external interconnect 708 can be attached to the base substrate pad 706. The external interconnect 708 can be attached under the bottom of the base substrate 704.

The base integrated circuit package 702 can include a base component 710, which can include a redistribution layer (RDL) die. The base component 710 can include a base component inactive side 712, such as a backside. The base component 710 can include a base component active side 714, such as an active side that includes active circuitry, over the base component inactive side 712.

The base component 710 can be attached over the base substrate 704 by a base attach layer 716, such as a die attach, an adhesive, or an underfill. The base attach layer 716 can attach the base component inactive side 712 and the top surface of the base substrate 704. The base component 710 can be connected to the base substrate 704 by a base interconnect 718, such as a bond wire or a conductive wire. The base interconnect 718 can connect a base component pad 720, such as an electrical contact or a contact pad, at the base component active side 714 and the base substrate pad 706 at the top of the base substrate 704.

The base integrated circuit package 702 can include an exposed interconnect 728, such as an exposed solder-on-pad (eSOP), a recessed eSOP, a solder ball, or a solder bump. The exposed interconnect 728 can be attached on or connected to another of the base component pad 720 at the base component active side 714. The exposed interconnect 728 can be formed in a full array at the top center of the base integrated circuit package 702 for providing connectivity with another package or component.

The base component pad 720 can be redistributed through redistribution processes including the RDL to a metal pad in an area array, such as an array of pads or contacts on which the exposed interconnect 728 can be attached or connected thereon. Such redistribution processes can provide connectivity between the exposed interconnect 728 and the base substrate 704 by the base interconnect 718.

The base integrated circuit package 702 can include a base encapsulation 730, such as a cover including an epoxy molding compound, an encapsulation material, or a molding material, formed over the base substrate 704, the base component 710, the base interconnect 718, and the exposed interconnect 728. The integrated circuit packaging system 700 can include the encapsulation system 132 of FIG. 1 or the encapsulation system 202 of FIG. 2 for forming the base encapsulation 730 in the base integrated circuit package 702. The base encapsulation 730 can include a recess 732.

The base encapsulation 730 can include a recess taper sidewall 734 in the recess 732. The base encapsulation 730 can expose a portion of the exposed interconnect 728 in the recess 732.

The integrated circuit packaging system 700 can include a package-to-package interconnect 736, such as a solder ball or a solder bump, attached on or connected to the exposed interconnect 728. The integrated circuit packaging system 700 can include a stack integrated circuit package 738.

The stack integrated circuit package 738 can include a stack substrate 740, such as a printed circuit board (PCB), a laminated plastic substrate, a laminated ceramic substrate, or a carrier. The stack substrate 740 can include a stack substrate pad 742, such as an electrical contact or a contact pad, for providing electrical connection to the stack substrate 740. The stack substrate pad 742 can include any planar dimension.

The stack integrated circuit package 738 can be mounted over the base integrated circuit package 702. The package-to-package interconnect 736 can connect the stack substrate pad 742 at the bottom surface of the stack substrate 740 and the exposed interconnect 728.

The stack integrated circuit package 738 can include a first stack component 744, such as a wirebond integrated circuit or a bare die, attached over the stack substrate 740 by a first stack attach layer 746, such as a die attach, an adhesive, or an underfill. The first stack component 744 can be connected to the stack substrate pad 742 at the top surface of the stack substrate 740 by a first stack interconnect 748, such as a bond wire or a conductive wire.

The stack integrated circuit package 738 can include a second stack component 750, such as a wirebond integrated circuit or a bare die, attached over the first stack component 744 by a second stack attach layer 752, such as a die attach, an adhesive, or an underfill. The second stack component 750 can be connected to the stack substrate pad 742 at the top surface of the stack substrate 740 by a second stack interconnect 754, such as a bond wire or a conductive wire.

The stack integrated circuit package 738 can include a stack encapsulation 756, such as a cover including an epoxy molding compound, an encapsulation material, or a molding material. The stack encapsulation 756 can be formed over the stack substrate 740, the first stack component 744, the first stack interconnect 748, the second stack component 750, and the second stack interconnect 754.

Referring now to FIG. 8, therein is shown a top view of the integrated circuit packaging system 600 without the stack integrated circuit package 638 of FIG. 6. The integrated circuit packaging system 600 can include the exposed interconnect 628 attached on or connected to the top of the interface module 620 of FIG. 6. The exposed interconnect 628 can be formed in a full array at the top center of the base integrated circuit package 602 for providing connectivity with another package or component, such as the stack integrated circuit package 638.

The integrated circuit packaging system 600 can include the base encapsulation 630 formed over the exposed interconnect 628. The base encapsulation 630 can include the recess 632. The base encapsulation 630 can expose a portion of the exposed interconnect 628 in the recess 632.

Figure 9:
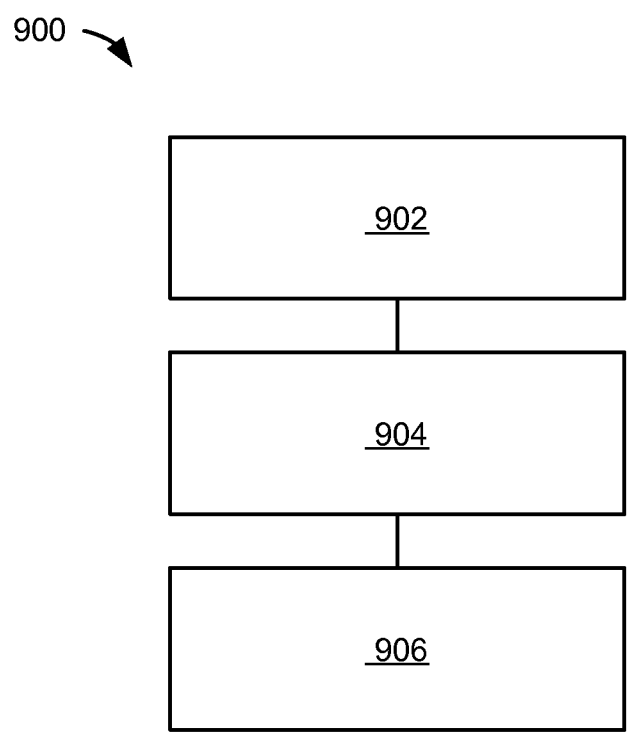
FIG. 9 is a flow chart of a method of manufacture of an integrated circuit packaging system in a further embodiment of the present invention.

Referring now to FIG. 9, therein is shown a flow chart of a method 900 of manufacture of an integrated circuit packaging system in a further embodiment of the present invention. The method 900 includes: providing an encapsulation system having a mold chase with a buffer layer attached thereto in a block 902; forming a base integrated circuit package including: providing a base substrate, connecting an exposed interconnect to the base substrate, a portion of the exposed interconnect having the buffer layer attached thereon, mounting a base component over the base substrate, forming a base encapsulation over the base substrate and the exposed interconnect using the encapsulation system in a block 904; and releasing the encapsulation system providing the portion of the exposed interconnect exposed from the base encapsulation, the exposed interconnect having characteristics of the buffer layer removed in a block 906.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit packaging system comprising:
  (a) a base integrated circuit package including:
    a base substrate,
    an exposed interconnect connected to the base substrate,
    a base component over the base substrate,
    a base encapsulation, and
  (b) an encapsulation system including
    a mold chase,
    a buffer layer attachable to the mold chase, the buffer layer and the mold chase operable to engage the exposed interconnect,
    wherein the exposed interconnect, partially exposed from the base encapsulation, exhibits physical features that are imprint images of that of the buffer layer and the mold chase.

2. The system as claimed in claim 1 wherein the buffer layer includes a soft material.

3. The system as claimed in claim 1 wherein the exposed interconnect includes the exposed interconnect on the base substrate and adjacent the base component, the base component partially exposed from the base encapsulation.

4. The system as claimed in claim 1 wherein the base integrated circuit package includes an interface module over the base substrate, the interface module having the exposed interconnect attached thereon.

5. The system as claimed in claim 1 wherein the base component includes the base component over the base substrate, the base component having the exposed interconnect attached thereto.

6. The system as claimed in claim 1 wherein
  the buffer layer is operable to protect portions of the exposed interconnect when the buffer layer engages the exposed interconnect; and
  the base encapsulation includes a recess in which a portion of the exposed interconnect is exposed, the recess exhibiting physical features that are imprint images of that of the buffer layer and the mold chase.

7. The system as claimed in claim 6 wherein the base encapsulation having characteristics of being formed by the encapsulation system with the buffer layer includes the encapsulation system with a film.

8. The system as claimed in claim 6 further comprising a stack integrated circuit package over the base integrated circuit package, the base integrated circuit package having an interface module over the base component and with the exposed interconnect attached thereon.

9. The system as claimed in claim 6 further comprising a stack integrated circuit package over the base integrated circuit package, whereby the base integrated circuit package having the base component includes a redistribution layer die with the exposed interconnect attached thereon.

* * * * *